United States Patent [19]

Furuchi

[11] Patent Number: 5,721,516
[45] Date of Patent: Feb. 24, 1998

[54] CMOS INVERTER

[75] Inventor: Masaki Furuchi, Tokyo, Japan

[73] Assignee: NEC Corporation, Tokyo, Japan

[21] Appl. No.: 712,840

[22] Filed: Sep. 12, 1996

[30] Foreign Application Priority Data

Sep. 13, 1995 [JP] Japan ................. 7-234963

[51] Int. Cl.$^6$ ................. H03B 5/36; H03F 3/16
[52] U.S. Cl. ................. 331/116 FE; 331/108 A; 331/DIG. 3; 326/120; 326/121; 330/277
[58] Field of Search ................. 331/57, 108 A, 331/116 R, 116 FE, 117 R, 117 FE, 158, DIG. 3; 326/112, 119–121, 122; 330/277

[56] References Cited

U.S. PATENT DOCUMENTS 4,746,875  5/1988  O'Leary ................. 330/253

*Primary Examiner*—David Mis
*Attorney, Agent, or Firm*—Sughrue, Mion, Zinn, Macpeak & Seas, PLLC

[57] ABSTRACT

A CMOS inverter capable of reducing a through current therein including an E-type PMOS transistor, an E-type NMOS transistor and a D-type NMOS transistor. In the E-type PMOS transistor, the gate and the drain are connected to input and output terminals. In the E-type NMOS transistor, the gate and the drain are connected to the input and the output terminals and the source to the ground. In the D-type NMOS transistor, the source is connected to the source of the E-type PMOS transistor, the gate to the ground, and the drain to a power source.

3 Claims, 6 Drawing Sheets

CM OS INVERTER

BACKGROUND OF THE INVENTION

The present invention relates to a CMOS (complementary metal-oxide semiconductor) inverter.

DESCRIPTION OF THE RELATED ART

In recent years, inverters have been used for a variety of circuits. One use example is a CMOS oscillator circuit. A basic construction of such a conventional CMOS oscillator circuit is shown in FIG. 1.

In FIG. 1, the CMOS oscillator circuit comprises a CMOS inverter 101, a feedback resistor 105 connected between input and output terminals 106 and 107, a crystal oscillator 108 coupled between the input and the output terminals 106 and 107 and capacitors 109 and 110 connected between the input and the output terminals 106 and 107 and the ground power source (GND) 112. The CMOS inverter 101 includes a P-channel (P) MOS transistor 102 and an N-channel (N) MOS transistor 103. In the PMOS transistor 102, the source is connected to a power source VDD 104 and the gate and the drain are linked to the input and the output terminals 106 and 107. In the NMOS transistor 103, the source is coupled with the GND 112 and the drain and the gate are connected to the input and the output terminals 106 and 107.

An operation of this CMOS oscillator circuit is well-known and thus a description thereof can be omitted for brevity. In this oscillator circuit, the CMOS inverter 101 functions as an analog inverting amplifier. As long as the CMOS inverter 101 oscillates, a so-called through current flows between the power source and the GND through the CMOS inverter 101, resulting in dissipation of power. This power dissipation increases with an increase in the oscillation frequency.

A characteristic of a through current against an input voltage of the CMOS inverter 101 is shown by a curve L3 in FIG. 5. In FIG. 5, the input voltage is plotted in the horizontal axis and the through current in the vertical axis. In this case, the input voltage varies between 0 (V) to 5 (V), a threshold value is approximately 2.5 (V). The curve L3 clearly shows that the through current of at most approximately 800 μA at the peak of its threshold value 2.5 (V) flows in the CMOS inverter. In the CMOS inverter to be employed as an oscillator circuit, the input voltage changes in the range of 2 to 3 (V) around the threshold value, and the consumption power of the CMOS inverter 101 becomes large.

In FIG. 2, there is shown a conventional CMOS inverter in which a through current is limited to reduce its consumption power, as disclosed in Japanese Patent Application Laid-Open Publication No. 4-273718. This CMOS inverter comprises a depletion (D) type NMOS transistor 213, an enhancement (E) type PMOS transistor 202 and an E-type NMOS transistor 203. In the D-type NMOS transistor 213, the drain is connected to a power source VDD 104 and the gate is coupled with the source. In the E-type PMOS transistor 202, the source is linked to the source of the D-type NMOS transistor 213 and the gate and the drain are connected to the input and the output terminals 106 and 107. In the E-type NMOS transistor 203, the gate and drain are connected to the input and the output terminals 106 and 107 and the source is coupled with the GND 112. In this improved CMOS inverter, the D-type NMOS transistor 213 acts as a current limiting transistor to reduce the through current. That is, the E-type PMOS transistor 202 and the E-type NMOS transistor 203 are conducted and a through current of more than a saturation current flows in the D-type NMOS transistor 213. As a result, the D-type NMOS transistor 213 is saturated and only a limited current within a predetermined current can flow in the saturated area. That is, no current beyond the predetermined current can flow in the saturated area. The through current of this CMOS inverter is shown by a curve L2 in FIG. 5. As clearly shown by the curve L2, the peak current of the through current is changed to approximately 400 μm at the input voltage of approximately 2.0 (V) in the presence of the D-type NMOS transistor 213. As a result, the through current can be reduced and the consumption power can be thus reduced.

However, in this case, the gate is connected to the drain in the D-type NMOS transistor 213 shown in FIG. 2, and the voltage between the gate and the source is always constant. In other words, the through current is restricted by the saturation current of the D-type NMOS transistor 213.

Recently, a lower consumption power of integrated circuits has been demanded stronger and stronger and the CMOS inverter shown in FIG. 2 cannot meet this demand.

SUMMARY OF THE INVENTION

Accordingly it is an object of the present invention to provide a CMOS inverter in view of the aforementioned disadvantages of the prior art, which is capable reducing a through current and further reducing consumption power of the CMOS inverter.

In accordance with one aspect of the present invention, there is provided an inverter comprising a first power source line; a second power source line; a first MOS transistor of a first conductivity type, which is connected between a node and an output terminal and has a gate connected to an input terminal; a second MOS transistor of a second conductivity type, which is connected between the output terminal and the second power source line and has a gate connected to the input terminal; and a third MOS transistor of a depletion type and of the second conductivity type, which is connected between the first power source line and the node and has a gate connected to the second power source line.

An inverter of the present invention, preferably, the first conductivity type is a P-channel type and the second conductivity type is an N-channel type.

In accordance with another aspect of the present invention, there is provided an inverter to be used for an oscillator circuit including an input terminal, an output terminal, an oscillator connected between the input and output terminals, a first capacitor element connected between the input terminal and a first power source line, a second capacitor element connected between the output terminal and the first power source line, and a resistor element connected between the input and output terminals, comprising a first MOS transistor of a first conductivity type, which is connected between a node and the output terminal and has a gate connected to the input terminal; a second MOS transistor of a second conductivity type, which is connected between the output terminal and the first power source line and has a gate connected to the input terminal; and a third MOS transistor of a depletion type and of the second conductivity type, which is connected between a second power source line and the node and has a gate connected to the first power source line.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 3:
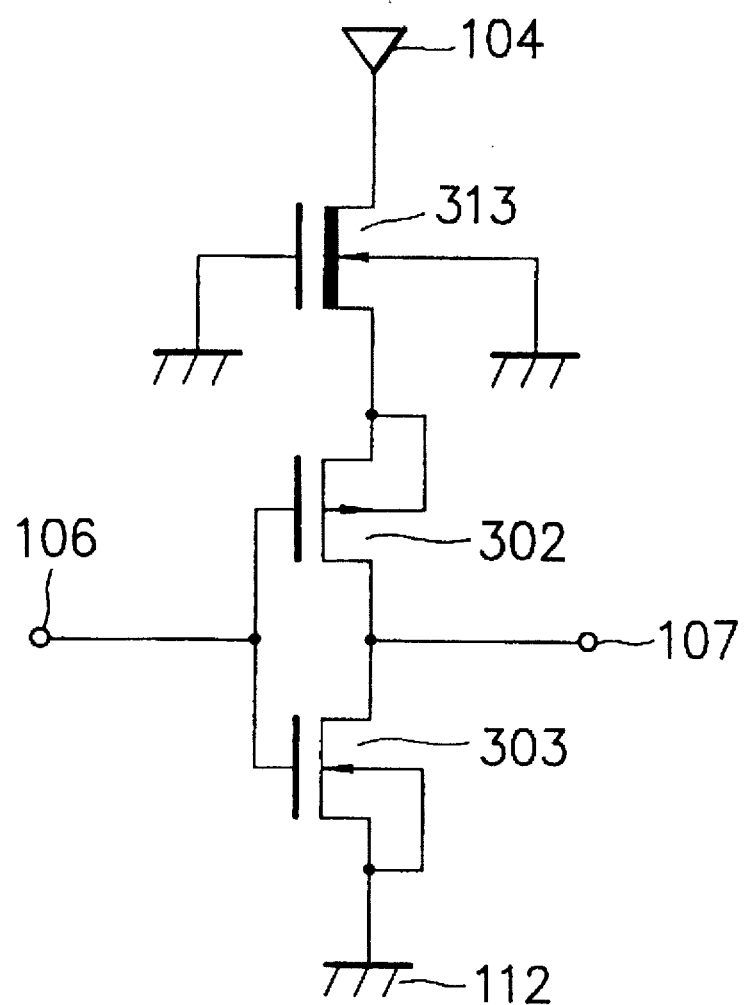
FIG. 3 is a circuit diagram of a CMOS inverter according to one embodiment of the present invention.

Referring now to the drawings, in FIG. 3, there is shown a CMOS inverter according to one embodiment of the present invention.

In FIG. 3, the CMOS inverter 301 comprises a D-type NMOS transistor 313, an E-type PMOS transistor 302 and an E-type NMOS transistor 303. In the D-type NMOS transistor 313, the drain is connected to a power source VDD 104 and the gate is coupled with the ground power source GND 112. In the E-type PMOS transistor 302, the source is linked to the source of the D-type NMOS transistor 313, and the gate and the drain are connected to the input and the output terminals 106 and 107. In the E-type NMOS transistor 303, the source is coupled with the GND 112, and the gate and the drain are connected to the input and output terminals 106 and 107.

Figure 4:
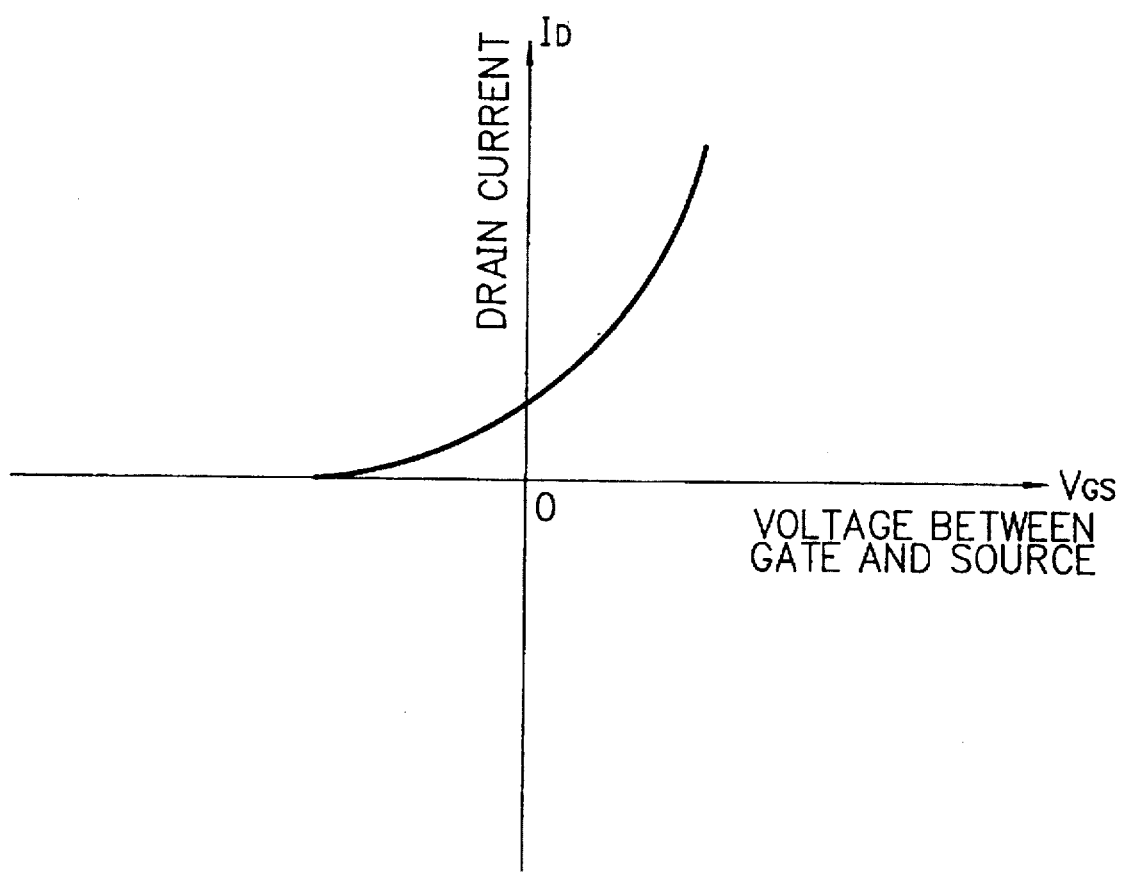
FIG. 4 is a graphical representation showing a characteristic of a drain current against a voltage between a gate and a source of a D-type NMOS transistor shown in FIG. 3.

The D-type NMOS transistor 313 possesses a characteristic of a drain current against a voltage between the gate and the source, as shown in FIG. 4. That is, a reduction of the voltage between the gate and the source leads to a reduction of the drain current. The present invention positively utilizes this characteristic. That is, in the D-type NMOS transistor 313, the gate is separated from the source and is connected to the GND 112. Hence, when the current flowing in the D-type NMOS transistor 313 increases, since this current also flows in the transistors 302 and 303, the voltage drop with the transistors 302 and 303 increases the source voltage of the D-type NMOS transistor 313. On the other hand, since the gate of the D-type NMOS transistor 313 is connected to the GND 112, it follows that the voltage between the gate and the source of the D-type NMOS transistor 313 is dropped (or is changed to the negative direction) and that the drain current flowing in the D-type NMOS transistor 313 becomes small. As a result, limiting the current can be affected stronger.

Figure 1:
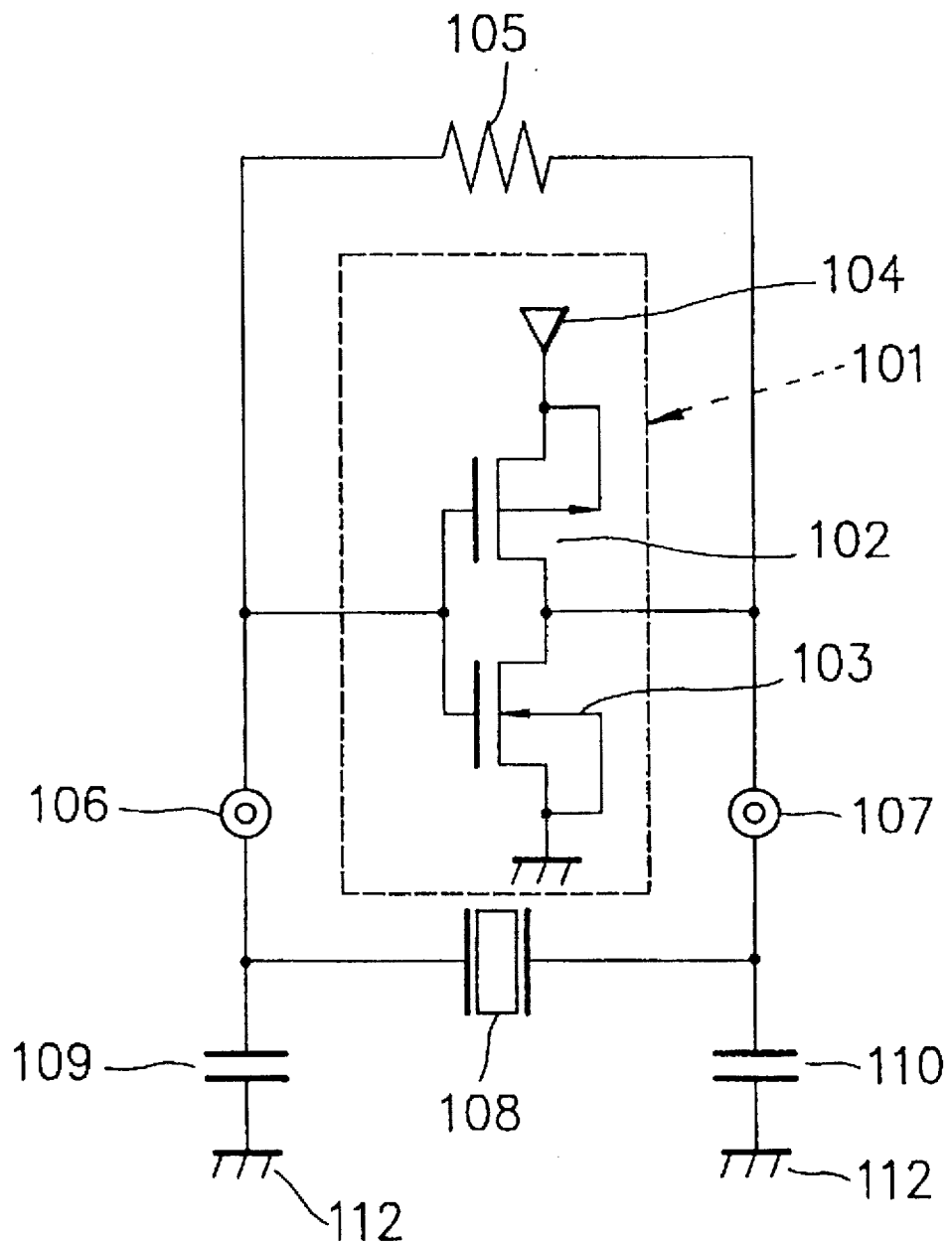
FIG. 1 is a circuit diagram showing a conventional CMOS inverter type oscillator.
Figure 2:
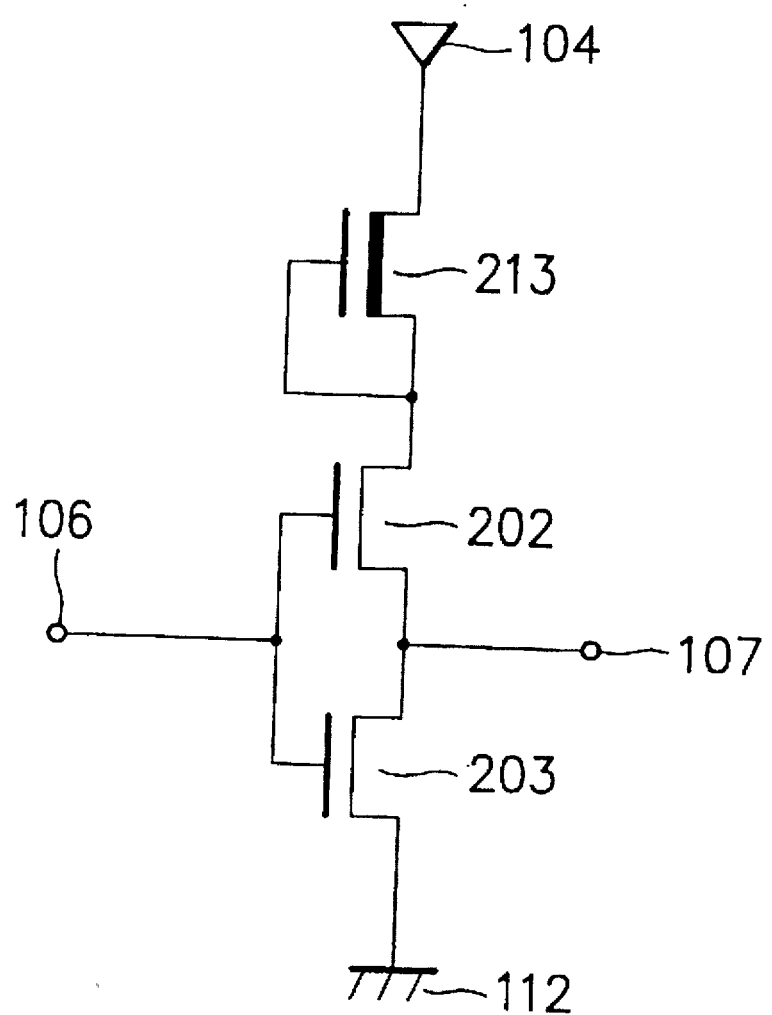
FIG. 2 is a circuit diagram showing another conventional improved inverter.
Figure 5:
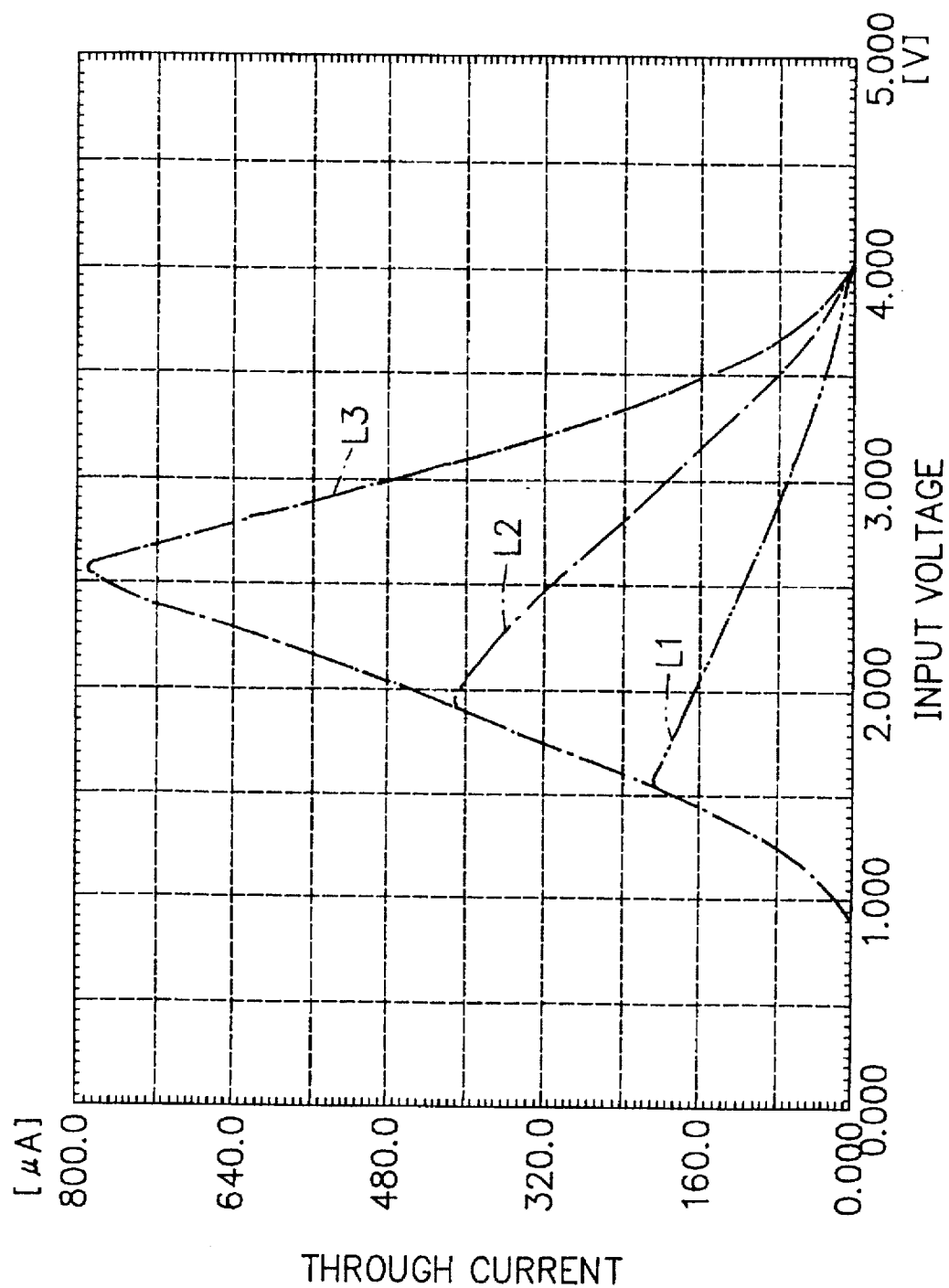
FIG. 5 is a graphical representation showing a through current of the CMOS inverter shown in FIG. 3 along with those of the conventional inverters shown in FIGS. 1 and 2.

Specifically, the through current characteristic shown by a curve L1 in FIG. 5 can be obtained by the D-type NMOS transistor 313, and the peak of the through current is changed to approximately 200 μA at the input voltage of approximately 1.5 (V). This value is approximately a quarter of that of the conventional CMOS inverter shown in FIG. 1 and is approximately half of that of the conventional CMOS inverter shown in FIG. 2, using the D-type NMOS transistor 313 with the gate connected to the source. In the present invention, as apparent from the curve L1, the peak of the through current is changed to at the input voltage of approximately 1.5 (V) which is largely separated from the center 2.5 (V) of the input voltage, away from the peak of the through current of the curve L3 or L2, as shown in FIG. 5. It is readily understood that the further reduction of the consumption power can be remarkably attained.

As described above, according to the present invention, the through current flowing in the CMOS inverter can be reduced and the peak of the through current can be largely separated from the central voltage of the input voltage. As a result, the consumption power of the CMOS inverter can be largely reduced.

Figure 6:
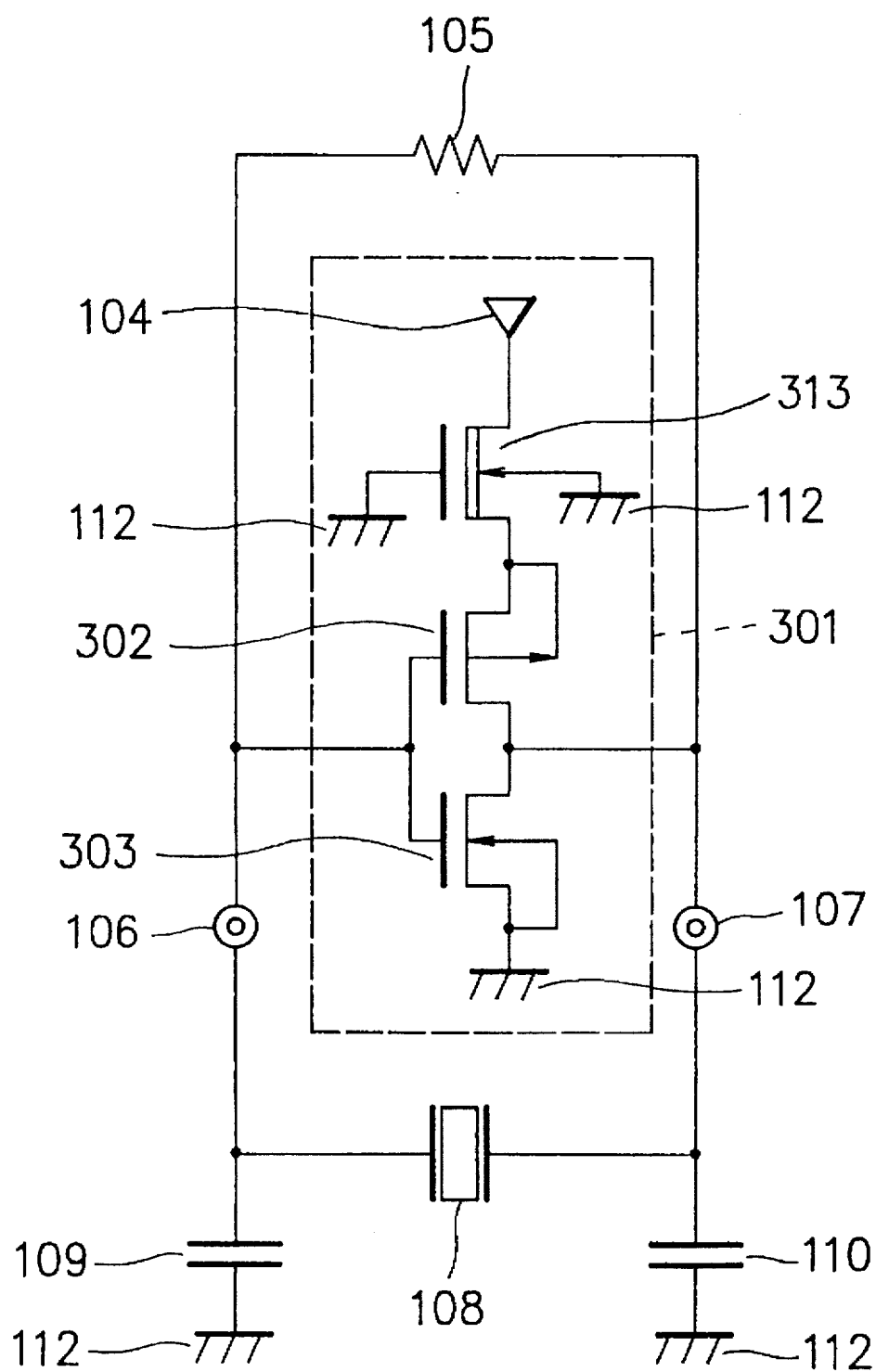
FIG. 6 is an oscillator to which the inverter of the present invention is applied.

In FIG. 6, there is shown an oscillator circuit to which a CMOS inverter according to the present invention is applied. In this case, the present CMOS inverter 301 shown in FIG. 3 is used in place of the CMOS inverter 101 of the conventional oscillator circuit shown in FIG. 1. Like this oscillator, in particular, the CMOS inverter of the present invention can be applied to a circuit to input high frequency analog signals with high efficacy and the consumption power of the CMOS inverter can be largely reduced.

In this embodiment, the E-type PMOS transistor 302 is arranged between the GND 112 and the E-type NMOS transistor 303 and the D-type NMOS transistor 313 between the power source VDD 104 and the E-type PMOS transistor 302, resulting in reducing the through current, as described above. Further, when charging or discharging a load coupled with the output terminal 107, the load is charged or discharged via the D-type PMOS transistor 313 or the E-type transistor 302 in charging or discharging. Hence, the time for charging and discharging can be nearly equal and the rising and falling speeds of the output voltage with respect to the variation of the input voltage can be nearly equal. As a result, a stable operation can be obtained in the CMOS inverter according to the present invention.

Furthermore, according to the present invention, it is readily understood that the potential of the power source can be inverted and the conductivity types of the transistors can be inverted. Moreover, it is clear that in place of proving with the D-type NMOS transistor 313 between the power source 104 and the E-type PMOS transistor 302, a D-type PMOS transistor can be arranged between the E-type NMOS transistor 303 and the GND 112.

As described above, according to the present invention, the capability of restricting the current increases as the current flowing in the D-type MOS transistor increases. As a result, the through current of the CMOS inverter is reduced and the consumption power can be further reduced.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An inverter comprising:

a first power source line;

a second power source line;

a first MOS transistor of a first conductivity type, which is connected between a node and an output terminal and has a gate connected to an input terminal;

a second MOS transistor of a second conductivity type, which is connected between the output terminal and the second power source line and has a gate connected to the input terminal; and a third MOS transistor of a depletion type and of the second conductivity type, which is connected between the first power source line and the node and has a gate connected to the second power source line.

2. An inverter of claim 1, wherein the first conductivity type is a P-channel type and the second conductivity type is an N-channel type.

3. An inverter to be used for an oscillator circuit including an input terminal, an output terminal, an oscillator connected between the input and output terminals, a first capacitor element connected between the input terminal and a first power source line, a second capacitor element connected between the output terminal and the first power source line, and a resistor element connected between the input and output terminals, comprising:

a first MOS transistor of a first conductivity type which is connected between a node and the output terminal and has a gate connected to the input terminal;

a second MOS transistor of a second conductivity type, which is connected between the output terminal and the first power source line and has a gate connected to the input terminal; and a third MOS transistor of a depletion type and of the second conductivity type, which is connected between a second power source line and the node and has a gate connected to the first power source line.

* * * * *